(12) United States Patent
Nassar et al.

(10) Patent No.: US 10,659,061 B2
(45) Date of Patent: May 19, 2020

(54) DIVIDER-LESS FRACTIONAL PLL ARCHITECTURE

(71) Applicant: Intel Corporation, Santa Clara, CA (US)

(72) Inventors: Elias Nassar, Haifa (IL); Eyal Fayneh, Givatyim (IL); Inbar Falkov, Tel Aviv (IL); Elan Banin, Raanana (IL); Rotem Banin, Even-Yehuda (IL); Ofir Degani, Haifa (IL); Samer Nassar, Nazareth (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/472,835

(22) PCT Filed: Dec. 27, 2016

(86) PCT No.: PCT/US2016/068696
§ 371 (c)(1),
(2) Date: Jun. 21, 2019

(87) PCT Pub. No.: WO2018/125046
PCT Pub. Date: Jul. 5, 2018

(65) Prior Publication Data
US 2019/0334533 A1    Oct. 31, 2019

(51) Int. Cl.
*H03D 3/24*    (2006.01)
*H03L 7/091*    (2006.01)
*H03L 7/099*    (2006.01)

(52) U.S. Cl.
CPC ............ *H03L 7/091* (2013.01); *H03L 7/0997* (2013.01); *H03L 2207/50* (2013.01)

(58) Field of Classification Search
CPC ... H03L 7/091; H03L 7/0997; H03L 2207/50; H03L 7/10; H03L 7/18; H03L 7/0994; H03L 7/085
(Continued)

(56) References Cited

U.S. PATENT DOCUMENTS

2007/0291173 A1    12/2007   Hsin
2012/0081159 A1    4/2012    Wu
(Continued)

FOREIGN PATENT DOCUMENTS

JP    2012049660 A    3/2012
WO    WO-2018125046 A1    7/2018

OTHER PUBLICATIONS

"International Application Serial No. PCT/US2016/068696, International Search Report dated Aug. 18, 2017", 3 pgs.
(Continued)

*Primary Examiner* — Phuong Phu
(74) *Attorney, Agent, or Firm* — Schwegman Lundberg & Woessner, P.A.

(57) ABSTRACT

A divider-less fractional digital phase locked loop (PLL) is disclosed and can include a time-to-digital converter (TDC) to receive a reference clock signal and a digitally control oscillator (DCO) clock signal, and generate a phase difference signal based on the reference clock signal and the DCO clock signal. A counter coupled in parallel to the TDC can receive the clock signal and count an output frequency of the clock signal to detect reference noise within the reference signal that is above a threshold. A sampler can sample an output of the counter using a replica of the reference signal, and generate a plurality of samples. A sample selector can select one of the plurality of samples based on the phase difference signal. A digital phase detector (DPD) can generate an output phase measurement based on the phase
(Continued)

difference signal and the selected sample of the plurality of samples.

27 Claims, 7 Drawing Sheets

(58) Field of Classification Search
USPC .............................. 375/376, 375, 374, 373
See application file for complete search history.

(56) References Cited

U.S. PATENT DOCUMENTS

| | | |
|---|---|---|
| 2012/0100821 A1 | 4/2012 | Dan et al. |
| 2013/0002317 A1* | 1/2013 | Frantzeskakis ........... H03L 7/18 327/156 |
| 2013/0113528 A1* | 5/2013 | Frantzeskakis ........... H03L 7/10 327/117 |
| 2015/0249455 A1 | 9/2015 | Burg et al. |
| 2016/0204787 A1* | 7/2016 | Lotfy ...................... H03L 7/085 327/142 |
| 2017/0201260 A1* | 7/2017 | Unruh ................... H03L 7/0994 |
| 2017/0205772 A1* | 7/2017 | Burg ....................... H03L 7/091 |

OTHER PUBLICATIONS

"International Application Serial No. PCT/US2016/068696, Written Opinion dated Aug. 18, 2017", 4 pgs.

\* cited by examiner

DIVIDER-LESS FRACTIONAL PLL ARCHITECTURE

CROSS-REFERENCE TO RELATED APPLICATION

This application is a U.S. National Stage Filing under 35 U.S.C. 371 from International Application No. PCT/US2016/068696, filed on Dec. 27, 2016, which application is incorporated herein by reference in its entirety.

TECHNICAL FIELD

Aspects of the disclosure pertain to radio frequency (RF) communications. Some aspects of the disclosure pertain to wireless communication devices. Some aspects of the disclosure pertain to front-end circuitry and radio integrated circuitry for wireless communication devices. Some aspects of the disclosure pertain to divider-less fractional phase locked loop (PLL) architectures in, e.g., wireless circuit cards for Wi-Fi devices. Some aspects of the disclosure pertain to divider-less fractional phase locked loop (PLL) for high-accuracy clock generator for I/O systems.

BACKGROUND

Divider-less phase locked loop (PLL) architecture is one of the techniques used for fractional frequency generation. However, the lack of a divider in the PLL feedback loop reduces the phase detector range to only one cycle of the PLL output frequency. Additionally, divider-less PLL architecture have higher sensitivity to reference jitter. For example, an increase in the reference jitter can results in a false measurement from the PLL's time-to-digital converter (TDC), which can cause the PLL to lose lock and shift its output frequency with regard to the target output frequency.

BRIEF DESCRIPTION OF THE FIGURES

In the figures, which are not necessarily drawn to scale, like numerals may describe similar components in different views. Like numerals having different letter suffixes may represent different instances of similar components. Some aspects of the disclosure are illustrated by way of example, and not limitation, in the following figures of the accompanying drawings.

DETAILED DESCRIPTION

The following description and the drawings sufficiently illustrate specific aspects of the disclosure to enable those skilled in the art to practice them. Other aspects of the disclosure may incorporate structural, logical, electrical, process, and other changes. Portions and features of some aspects of the present disclosure may be included in, or substituted for, those of other aspects of the present disclosure. Given the benefit of the present disclosure, persons skilled in the relevant technologies will be able to engineer suitable variations to implement principles of the aspects of the present disclosure in other types of communication systems. Various diverse aspects of the present disclosure may incorporate structural, logical, electrical, process, and other differences. Portions and features of some aspects of the present disclosure may be included in, or substituted for, those of other aspects of the present disclosure. Aspects of the disclosure set forth in the claims encompass all presently-known, and after-arising, equivalents of those claims.

Figure 1:
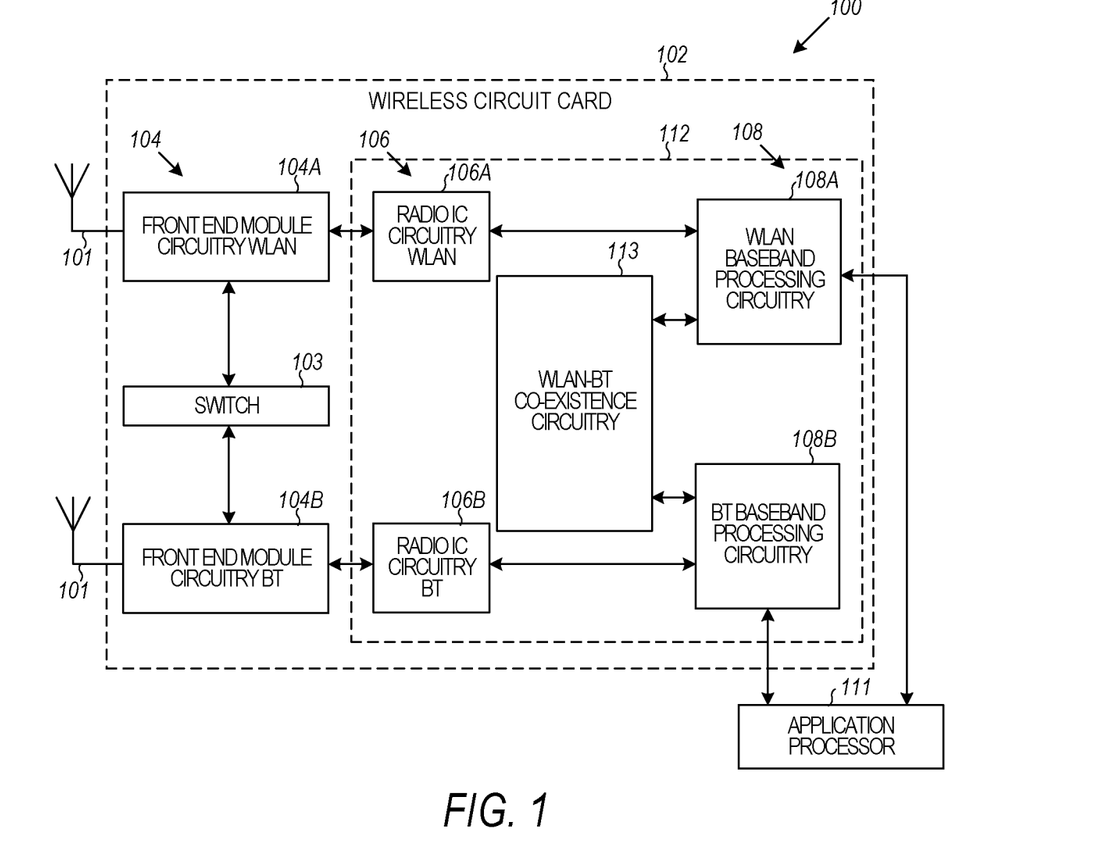
FIG. 1 is a block diagram of a radio architecture in accordance with some aspects of the present disclosure.

FIG. 1 is a block diagram of a radio architecture 100 in accordance with some aspects of the present disclosure. Radio architecture 100 may include radio front-end module (FEM) circuitry 104, radio IC circuitry 106 and baseband processing circuitry 108. Radio architecture 100 as shown includes both Wireless Local Area Network (WLAN) functionality and Bluetooth (BT) functionality although aspects of the disclosure are not so limited. In this disclosure, "WLAN" and "Wi-Fi" are used interchangeably.

FEM circuitry 104 may include a WLAN or Wi-Fi FEM circuitry 104a and a Bluetooth (BT) FEM circuitry 104b. The WLAN FEM circuitry 104a may include a receive signal path comprising circuitry configured to operate on WLAN RF signals received from one or more antennas 101, to amplify the received signals and to provide the amplified versions of the received signals to the WLAN radio IC circuitry 106a for further processing. The BT FEM circuitry 104b may include a receive signal path which may include circuitry configured to operate on BT RF signals received from one or more antennas 102, to amplify the received signals and to provide the amplified versions of the received signals to the BT radio IC circuitry 106b for further processing. FEM circuitry 104a may also include a transmit signal path which may include circuitry configured to amplify WLAN signals provided by the radio IC circuitry 106a for wireless transmission by one or more of the antennas 101. In addition, FEM circuitry 104b may also include a transmit signal path which may include circuitry configured to amplify BT signals provided by the radio IC circuitry 106b for wireless transmission by the one or more antennas. In the example of FIG. 1, although FEM 104a and FEM 104b are shown as being distinct from one another, aspects of the present disclosure are not so limited, and include within their scope the use of an FEM (not shown)

that includes a transmit path and/or a receive path for both WLAN and BT signals, or the use of one or more FEM circuitries where at least some of the FEM circuitries share transmit and/or receive signal paths for both WLAN and BT signals.

Radio IC circuitry 106 as shown may include WLAN radio IC circuitry 106a and BT radio IC circuitry 106b. The WLAN radio IC circuitry 106a may include a receive signal path which may include circuitry to down-convert WLAN RF signals received from the FEM circuitry 104a and provide baseband signals to WLAN baseband processing circuitry 108a. BT radio IC circuitry 106b may in turn include a receive signal path which may include circuitry to down-convert BT RF signals received from the FEM circuitry 104b and provide baseband signals to BT baseband processing circuitry 108b. WLAN radio IC circuitry 106a may also include a transmit signal path which may include circuitry to up-convert WLAN baseband signals provided by the WLAN baseband processing circuitry 108a and provide WLAN RF output signals to the FEM circuitry 104a for subsequent wireless transmission by the one or more antennas 101. BT radio IC circuitry 106b may also include a transmit signal path which may include circuitry to up-convert BT baseband signals provided by the BT baseband processing circuitry 108b and provide BT RF output signals to the FEM circuitry 104b for subsequent wireless transmission by the one or more antennas 101. In the example of FIG. 1, although radio IC circuitries 106a and 106b are shown as being distinct from one another, aspects of the present disclosure are not so limited, and include within their scope the use of a radio IC circuitry (not shown) that includes a transmit signal path and/or a receive signal path for both WLAN and BT signals, or the use of one or more radio IC circuitries where at least some of the radio IC circuitries share transmit and/or receive signal paths for both WLAN and BT signals.

In an example, the radio IC circuitry 106 can include one or more divider-less fractional phase locked loops (PLLs) for generating fractional frequency signals, such as signals with frequencies that are a fraction of a frequency of a reference signal. Further description of example divider-less fractional PLLs is provided herein in reference to FIGS. 5-10.

Baseband processing circuitry 108 may include a WLAN baseband processing circuitry 108a and a BT baseband processing circuitry 108b. The WLAN baseband processing circuitry 108a may include a memory, such as, for example, a set of RAM arrays in a Fast Fourier Transform or Inverse Fast Fourier Transform block (not shown) of the WLAN baseband processing circuitry 108a. Each of the WLAN baseband circuitry 108a and the BT baseband circuitry 108b may further include one or more processors and control logic to process the signals received from the corresponding WLAN or BT receive signal path of the radio IC circuitry 106, and to also generate corresponding WLAN or BT baseband signals for the transmit signal path of the radio IC circuitry 106. Each of the baseband processing circuitries 108a and 108b may further include physical layer (PHY) and medium access control layer (MAC) circuitry, and may further interface with application processor 110 for generation and processing of the baseband signals and for controlling operations of the radio IC circuitry 106.

Referring still to FIG. 1, according to the shown embodiment, WLAN-BT coexistence circuitry 113 may include logic providing an interface between the WLAN baseband circuitry 108a and the BT baseband circuitry 108b to enable use cases requiring WLAN and BT coexistence. In addition, a switch 103 may be provided between the WLAN FEM circuitry 104a and the BT FEM circuitry 104b to allow switching between the WLAN and BT radios according to application needs. In addition, although the antennas 101 are depicted as being respectively connected to the WLAN FEM circuitry 104a and the BT FEM circuitry 104b, aspects of the present disclosure include within their scope the sharing of one or more antennas as between the WLAN and BT FEMs, or the provision of more than one antenna connected to each of FEM 104a or 104b.

In some aspects of the present disclosure, the front-end module circuitry 104, the radio IC circuitry 106, and baseband processing circuitry 108 may be provided on a single radio card, such as wireless radio card 102. In some other aspects of the present disclosure, the one or more antennas 101, the FEM circuitry 104 and the radio IC circuitry 106 may be provided on a single radio card. In some other aspects of the present disclosure, the radio IC circuitry 106 and the baseband processing circuitry 108 may be provided on a single chip or integrated circuit (IC), such as IC 112.

In some aspects of the present disclosure, the wireless radio card 102 may include a WLAN radio card and may be configured for Wi-Fi communications, although the scope of the aspects of the present disclosure is not limited in this respect. In some of these aspects of the present disclosure, the radio architecture 100 may be configured to receive and transmit orthogonal frequency division multiplexed (OFDM) or orthogonal frequency division multiple access (OFDMA) communication signals over a multicarrier communication channel. The OFDM or OFDMA signals may comprise a plurality of orthogonal subcarriers.

In some of these multicarrier aspects of the present disclosure, radio architecture 100 may be part of a Wi-Fi communication station (STA) such as a wireless access point (AP), a base station or a mobile device including a Wi-Fi device. In some of these aspects of the present disclosure, radio architecture 100 may be configured to transmit and receive signals in accordance with specific communication standards and/or protocols, such as any of the Institute of Electrical and Electronics Engineers (IEEE) standards including, 802.11n-2009, IEEE 802.11-2012, 802.11n-2009, 802.11ac, and/or 802.11ax standards and/or proposed specifications for WLANs, although the scope of aspects of the present disclosure is not limited in this respect. Radio architecture 100 may also be suitable to transmit and/or receive communications in accordance with other techniques and standards.

In some aspects of the present disclosure, the radio architecture 100 may be configured for high-efficiency (HE) Wi-Fi (HEW) communications in accordance with the IEEE 802.11ax standard. In these aspects of the present disclosure, the radio architecture 100 may be configured to communicate in accordance with an OFDMA technique, although the scope of the aspects of the present disclosure is not limited in this respect.

In some other aspects of the present disclosure, the radio architecture 100 may be configured to transmit and receive signals transmitted using one or more other modulation techniques such as spread spectrum modulation (e.g., direct sequence code division multiple access (DS-CDMA) and/or frequency hopping code division multiple access (FH-CDMA)), time-division multiplexing (TDM) modulation, and/or frequency-division multiplexing (FDM) modulation, although the scope of the aspects of the present disclosure is not limited in this respect.

In some aspects of the present disclosure, as further shown in FIG. 1, the BT baseband circuitry 108b may be compliant with a Bluetooth (BT) connectivity standard such as Bluetooth, Bluetooth 4.0 or Bluetooth 5.0, or any other iteration of the Bluetooth Standard. In aspects of the present disclosure that include BT functionality as shown for example in FIG. 1, the radio architecture 100 may be configured to establish a BT synchronous connection oriented (SCO) link and or a BT low energy (BT LE) link. In some of the aspects of the present disclosure that include functionality, the radio architecture 100 may be configured to establish an extended SCO (eSCO) link for BT communications, although the scope of the aspects of the present disclosure is not limited in this respect. In some of these aspects of the present disclosure that include a BT functionality, the radio architecture may be configured to engage in a BT Asynchronous Connection-Less (ACL) communications, although the scope of the aspects of the present disclosure is not limited in this respect. In some aspects of the present disclosure, as shown in FIG. 1, the functions of a BT radio card and WLAN radio card may be combined on a single wireless radio card, such as single wireless radio card 102, although aspects of the present disclosure are not so limited, and include within their scope discrete WLAN and BT radio cards In some aspects of the present disclosure, the radio-architecture 100 may include other radio cards, such as a cellular radio card configured for cellular (e.g., 3GPP such as LTE, LTE-Advanced or 5G communications).

In some IEEE 802.11 aspects of the present disclosure, the radio architecture 100 may be configured for communication over various channel bandwidths including bandwidths having center frequencies of about 900 MHz, 2.4 GHz, 5 GHz, and bandwidths of about 1 MHz, 2 MHz, 2.5 MHz, 4 MHz, 5 MHz, 8 MHz, 10 MHz, 16 MHz, 20 MHz, 40 MHz, 80 MHz (with contiguous bandwidths) or 80+80 MHz (160 MHz) (with non-contiguous bandwidths). In some aspects of the present disclosure, a 320 MHz channel bandwidth may be used. The scope of the aspects of the present disclosure is not limited with respect to the above center frequencies however.

Figure 2:
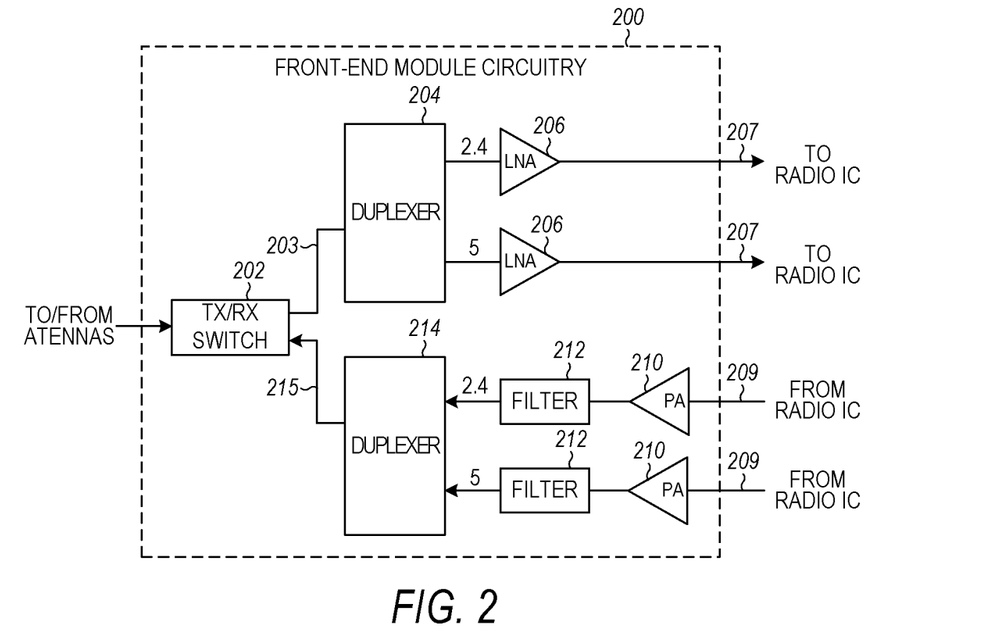
FIG. 2 illustrates a front-end module circuitry for use in the radio architecture of FIG. 1 in accordance with some aspects of the present disclosure.

FIG. 2 illustrates FEM circuitry 200 in accordance with some aspects of the present disclosure. The FEM circuitry 200 is one example of circuitry that may be suitable for use as the WLAN and/or BT FEM circuitry 104a/104b (FIG. 1), although other circuitry configurations may also be suitable.

In some aspects of the present disclosure, the FEM circuitry 200 may include a TX/RX switch 202 to switch between transmit mode and receive mode operation. The FEM circuitry 200 may include a receive signal path and a transmit signal path. The receive signal path of the FEM circuitry 200 may include a low-noise amplifier (LNA) 206 to amplify received RF signals 203 and provide the amplified received RF signals 207 as an output (e.g., to the radio IC circuitry 106 (FIG. 1)). The transmit signal path of the circuitry 200 may include a power amplifier (PA) to amplify input RF signals 209 (e.g., provided by the radio IC circuitry 106), and one or more filters 212, such as band-pass filters (BPFs), low-pass filters (LPFs) or other types of filters, to generate RF signals 215 for subsequent transmission (e.g., by one or more of the antennas 101 (FIG. 1)).

In some dual-mode aspects of the present disclosure for Wi-Fi communication, the FEM circuitry 200 may be configured to operate in either the 2.4 GHz frequency spectrum or the 5 GHz frequency spectrum. In these aspects of the present disclosure, the receive signal path of the FEM circuitry 200 may include a receive signal path duplexer 204 to separate the signals from each spectrum as well as provide a separate LNA 206 for each spectrum as shown. In these aspects of the present disclosure, the transmit signal path of the FEM circuitry 200 may also include a power amplifier 210 and a filter 212, such as a BPF, a LPF or another type of filter for each frequency spectrum and a transmit signal path duplexer 214 to provide the signals of one of the different spectrums onto a single transmit path for subsequent transmission by the one or more of the antennas 101 (FIG. 1). In some aspects of the present disclosure, BT communications may utilize the 2.4 GHZ signal paths and may utilize the same FEM circuitry 200 as the one used for WLAN communications.

Figure 3:
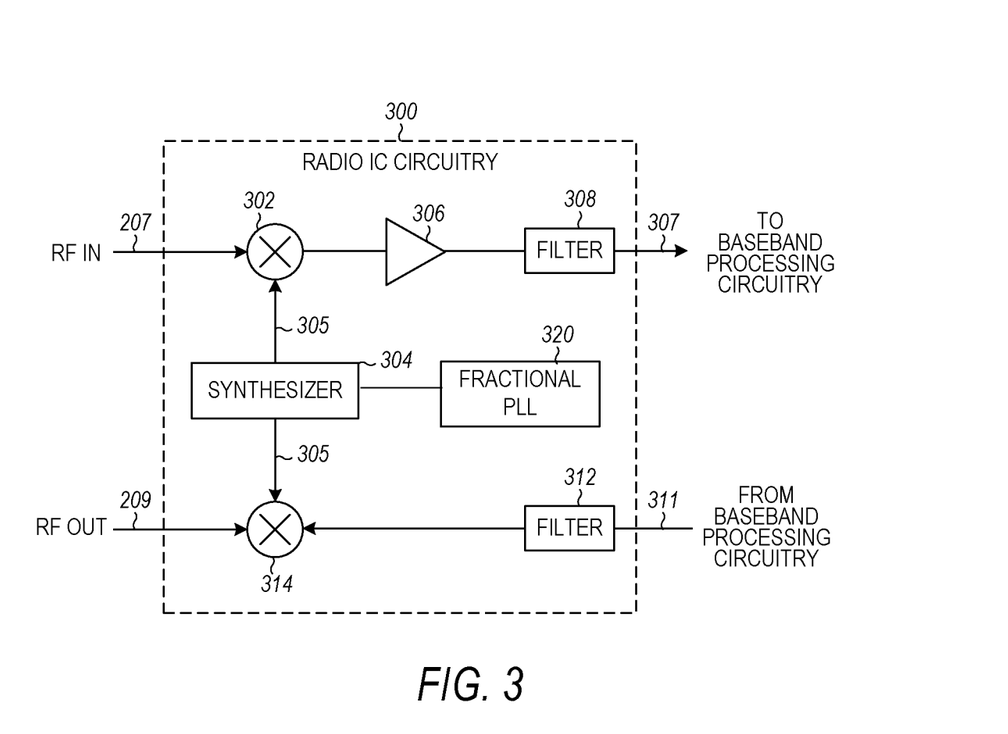
FIG. 3 illustrates a radio IC circuitry for use in the radio architecture of FIG. 1 in accordance with some aspects of the present disclosure.

FIG. 3 illustrates radio IC circuitry 300 in accordance with some aspects of the present disclosure. The radio IC circuitry 300 is one example of circuitry that may be suitable for use as the WLAN or BT radio IC circuitry 106a/106b (FIG. 1), although other circuitry configurations may also be suitable.

In some aspects of the present disclosure, the radio IC circuitry 300 may include a receive signal path and a transmit signal path. The receive signal path of the radio IC circuitry 300 may include at least mixer circuitry 302, such as, for example, down-conversion mixer circuitry, amplifier circuitry 306 and filter circuitry 308. The transmit signal path of the radio IC circuitry 300 may include at least filter circuitry 312 and mixer circuitry 314, such as, for example, up-conversion mixer circuitry. Radio IC circuitry 300 may also include synthesizer circuitry 304 for synthesizing a frequency 305 for use by the mixer circuitry 302 and the mixer circuitry 314. The mixer circuitry 302 and/or 314 may each, according to some aspects of the present disclosure, be configured to provide direct conversion functionality. The latter type of circuitry presents a much simpler architecture as compared with standard super-heterodyne mixer circuitries, and any flicker noise brought about by the same may be alleviated for example through the use of OFDM modulation. FIG. 3 illustrates only a simplified version of a radio IC circuitry, and may include, although not shown, aspects of the present disclosure where each of the depicted circuitries may include more than one component. For instance, mixer circuitry 320 and/or 314 may each include one or more mixers, and filter circuitries 308 and/or 312 may each include one or more filters, such as one or more BPFs and/or LPFs according to application needs. For example, when mixer circuitries are of the direct-conversion type, they may each include two or more mixers.

In some aspects of the present disclosure, mixer circuitry 302 may be configured to down-convert RF signals 207 received from the FEM circuitry 104 (FIG. 1) based on the synthesized frequency 305 provided by synthesizer circuitry 304. The amplifier circuitry 306 may be configured to amplify the down-converted signals and the filter circuitry 308 may include a LPF configured to remove unwanted signals from the down-converted signals to generate output baseband signals 307. Output baseband signals 307 may be provided to the baseband processing circuitry 108 (FIG. 1) for further processing. In some aspects of the present disclosure, the output baseband signals 307 may be zero-frequency baseband signals, although this is not a requirement. In some aspects of the present disclosure, mixer circuitry 302 may comprise passive mixers, although the scope of the aspects of the present disclosure is not limited in this respect.

In some aspects of the present disclosure, the synthesizer circuitry 304 can include a fractional PLL circuit 320 for generating fractional frequency signals, such as signals with frequencies that are a fraction of a frequency of a reference signal. Further description of example divider-less fractional PLLs is provided herein in reference to FIGS. 5-10. In some aspects of the disclosure, the PLL circuit 320 can be used to generate a clock frequency for a SoC DP (Display-Port), eDP (Embedded Display-Port), and HDMI Display I/O ports.

In some aspects of the present disclosure, the mixer circuitry 314 may be configured to up-convert input baseband signals 311 based on the synthesized frequency 305 provided by the synthesizer circuitry 304 to generate RF output signals 209 for the FEM circuitry 104. The baseband signals 311 may be provided by the baseband processing circuitry 108 and may be filtered by filter circuitry 312. The filter circuitry 312 may include a LPF or a BPF, although the scope of the aspects of the present disclosure is not limited in this respect.

In some aspects of the present disclosure, the mixer circuitry 302 and the mixer circuitry 314 may each include two or more mixers and may be arranged for quadrature down-conversion and/or up-conversion respectively with the help of synthesizer 304. In some aspects of the present disclosure, the mixer circuitry 302 and the mixer circuitry 314 may each include two or more mixers each configured for image rejection (e.g., Hartley image rejection). In some aspects of the present disclosure, the mixer circuitry 302 and the mixer circuitry 314 may be arranged for direct down-conversion and/or direct up-conversion, respectively. In some aspects of the present disclosure, the mixer circuitry 302 and the mixer circuitry 314 may be configured for super-heterodyne operation, although this is not a requirement.

Mixer circuitry 302 may comprise, according to one embodiment: quadrature passive mixers (e.g., for the in-phase (I) and quadrature phase (Q) paths). In such an embodiment, RF input signal 207 from FIG. 3 may be down-converted to provide I and Q baseband output signals to be sent to the baseband processor Quadrature passive mixers may be driven by zero and ninety-degree time-varying LO switching signals provided by a quadrature circuitry which may be configured to receive a LO frequency (fLO) from a local oscillator or a synthesizer, such as LO frequency 305 of synthesizer 304 (FIG. 3). In some aspects of the present disclosure, the LO frequency may be the carrier frequency, while in other aspects of the present disclosure, the LO frequency may be a fraction of the carrier frequency (e.g., one-half the carrier frequency, one-third the carrier frequency), generated by the fractional PLL circuitry 320. In some aspects of the present disclosure, the zero and ninety-degree time-varying switching signals may be generated by the synthesizer, although the scope of the aspects of the present disclosure is not limited in this respect.

In some aspects of the present disclosure, the LO signals may differ in duty cycle (the percentage of one period in which the LO signal is high) and/or offset (the difference between start points of the period). In some aspects of the present disclosure, the LO signals may have a 25% duty cycle and a 50% offset. In some aspects of the present disclosure, each branch of the mixer circuitry (e.g., the in-phase (I) and quadrature phase (Q) path) may operate at a 25% duty cycle, which may result in a significant reduction is power consumption.

The RF input signal 207 (FIG. 2) may comprise a balanced signal, although the scope of the aspects of the present disclosure is not limited in this respect. The I and Q baseband output signals may be provided to low-nose amplifier, such as amplifier circuitry 306 (FIG. 3) or to filter circuitry 308 (FIG. 3).

In some aspects of the present disclosure, the output baseband signals 307 and the input baseband signals 311 may be analog baseband signals, although the scope of the aspects of the present disclosure is not limited in this respect. In some alternate aspects of the present disclosure, the output baseband signals 307 and the input baseband signals 311 may be digital baseband signals. In these alternate aspects of the present disclosure, the radio IC circuitry may include analog-to-digital converter (ADC) and digital-to-analog converter (DAC) circuitry.

In some dual-mode aspects of the present disclosure, a separate radio IC circuitry may be provided for processing signals for each spectrum, or for other spectrums not mentioned here, although the scope of the aspects of the present disclosure is not limited in this respect.

In some aspects of the present disclosure, the synthesizer circuitry 304 may be a fractional-N synthesizer or a fractional N/N+1 synthesizer, although the scope of the aspects of the present disclosure is not limited in this respect as other types of frequency synthesizers may be suitable. For example, synthesizer circuitry 304 may be a delta-sigma synthesizer, a frequency multiplier, or a synthesizer comprising a phase-locked loop with a frequency divider. According to some aspects of the present disclosure, the synthesizer circuitry 304 may include digital synthesizer circuitry. An advantage of using a digital synthesizer circuitry is that, although it may still include some analog components, its footprint may be scaled down much more than the footprint of an analog synthesizer circuitry. In some aspects of the present disclosure, frequency input into synthesizer circuitry 304 may be provided by a voltage controlled oscillator (VCO), although that is not a requirement. A divider control input may further be provided by either the baseband processing circuitry 108 (FIG. 1) or the application processor 110 (FIG. 1) depending on the desired output frequency 305. In some aspects of the present disclosure, a divider control input (e.g., N) may be determined from a look-up table (e.g., within a Wi-Fi card) based on a channel number and a channel center frequency as determined or indicated by the application processor 110.

In some aspects of the present disclosure, synthesizer circuitry 304 may be configured to generate a carrier frequency as the output frequency 305, while in other aspects of the present disclosure, the output frequency 305 may be a fraction of the carrier frequency (e.g., one-half the carrier frequency, one-third the carrier frequency). In some aspects of the present disclosure, the output frequency 305 may be a LO frequency (fLO).

Figure 4:
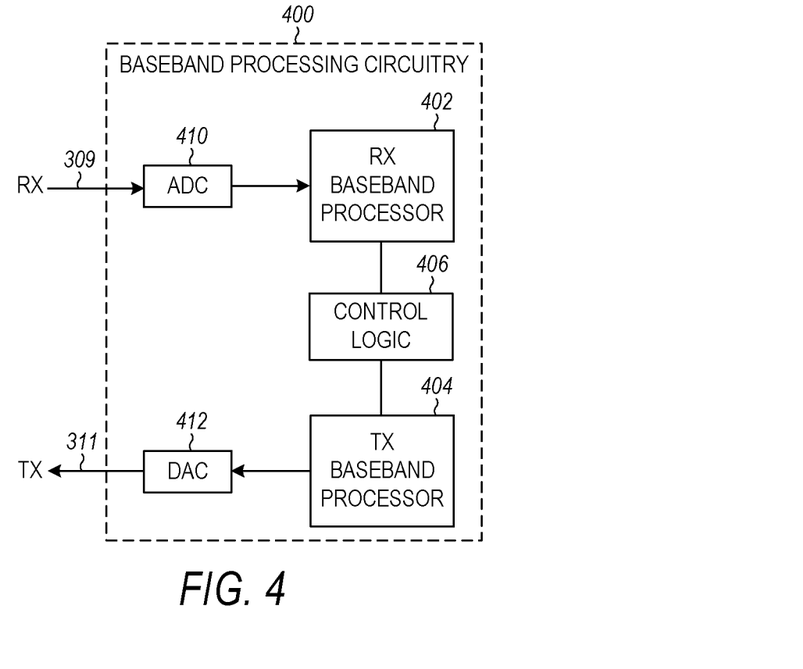
FIG. 4 illustrates a baseband processing circuitry for use in the radio architecture of FIG. 1 in accordance with some aspects of the present disclosure.

FIG. 4 illustrates a functional block diagram of baseband processing circuitry 400 in accordance with some aspects of the present disclosure. The baseband processing circuitry 400 is one example of circuitry that may be suitable for use as the baseband processing circuitry 108 (FIG. 1), although other circuitry configurations may also be suitable. The baseband processing circuitry 400 may include a receive baseband processor (RX BBP) 402 for processing receive baseband signals 309 provided by the radio IC circuitry 106 (FIG. 1) and a transmit baseband processor (TX BBP) 404 for generating transmit baseband signals 311 for the radio IC circuitry 106. The baseband processing circuitry 400 may also include control logic 406 for coordinating the operations of the baseband processing circuitry 400.

In some aspects of the present disclosure (e.g., when analog baseband signals are exchanged between the baseband processing circuitry 400 and the radio IC circuitry 106), the baseband processing circuitry 400 may include ADC 410 to convert analog baseband signals received from the radio IC circuitry 106 to digital baseband signals for processing by the RX BBP 402. In these aspects of the present disclosure, the baseband processing circuitry 400 may also include DAC 412 to convert digital baseband signals from the TX BBP 404 to analog baseband signals.

In some aspects of the present disclosure that communicate OFDM signals or OFDMA signals, such as through baseband processor 108a, the transmit baseband processor 404 may be configured to generate OFDM or OFDMA signals as appropriate for transmission by performing an inverse fast Fourier transform (IFFT). The receive baseband processor 402 may be configured to process received OFDM signals or OFDMA signals by performing an FFT. In some aspects of the present disclosure, the receive baseband processor 402 may be configured to detect the presence of an OFDM signal or OFDMA signal by performing an autocorrelation, to detect a preamble, such as a short preamble, and by performing a cross-correlation, to detect a long preamble. The preambles may be part of a predetermined frame structure for Wi-Fi communication.

Referring back to FIG. 1, in some aspects of the present disclosure, the antennas 101 (FIG. 1) may each comprise one or more directional or omnidirectional antennas, including, for example, dipole antennas, monopole antennas, patch antennas, loop antennas, microstrip antennas or other types of antennas suitable for transmission of RF signals. In some multiple-input multiple-output (MIMO) aspects of the present disclosure, the antennas may be effectively separated to take advantage of spatial diversity and the different channel characteristics that may result. Antennas 101 may each include a set of phased-array antennas, although aspects of the present disclosure are not so limited.

Although the radio-architecture 100 is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, field-programmable gate arrays (FPGAs), application specific integrated circuits (ASICs), radio-frequency integrated circuits (RFICs) and combinations of various hardware and logic circuitry for performing at least the functions described herein. In some aspects of the present disclosure, the functional elements may refer to one or more processes operating on one or more processing elements.

Figure 5:
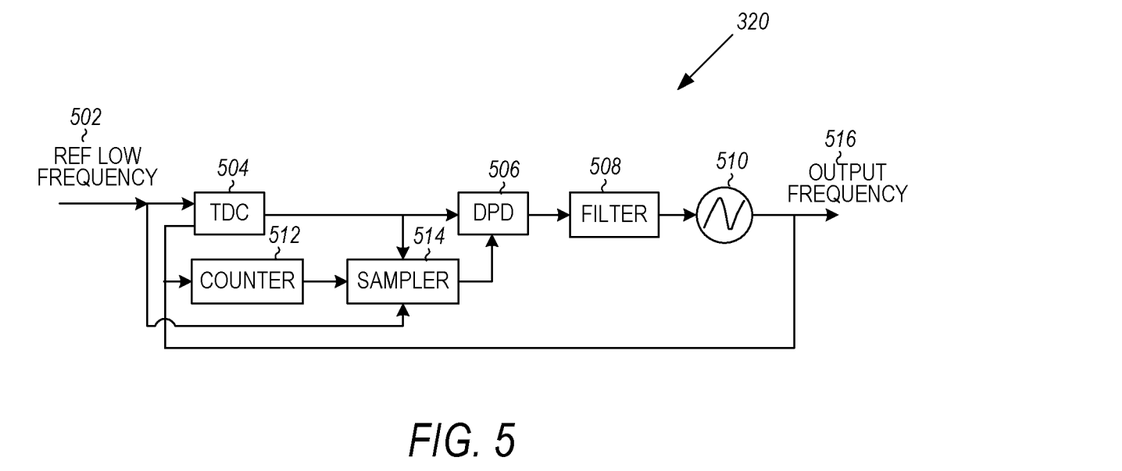
FIG. 5 illustrates a divider-less fractional PLL architecture in accordance with some aspects of the present disclosure.

FIG. 5 illustrates a divider-less fractional PLL architecture in accordance with some aspects of the present disclosure. Referring to FIG. 5, the fractional PLL 320 can include a time-to-digital converter (TDC) 504, a digital phase detector (DPD) 506, a filter 508, and a digitally controlled oscillator (DCO) 510. As seen in FIG. 5, the feedback path of the PLL 320 does not include a divider, and hence, the PLL 320 can also be referred to as divider-less fractional PLL 320. In an example, the output frequency signal 516 can be a fraction of the reference frequency signal 502. The TDC 504 can be configured to measure the phase difference between the reference signal 502 and the output frequency signal 516.

The divider-less fractional PLL 320 can be sensitive to reference jitter. For example, in instances when the reference signal jitter (e.g., deterministic jitter and/or reference jitter) exceeds half of the PLL output period, the TDC 504 can generate a false measurement resulting in leaning the PLL 320 to lose lock and shift its output frequency with regard to the target frequency. In accordance with example techniques discussed herein, the margin of the PLL 320 to reference noise can be extended, e.g., by a factor of 2.

Figure 8:
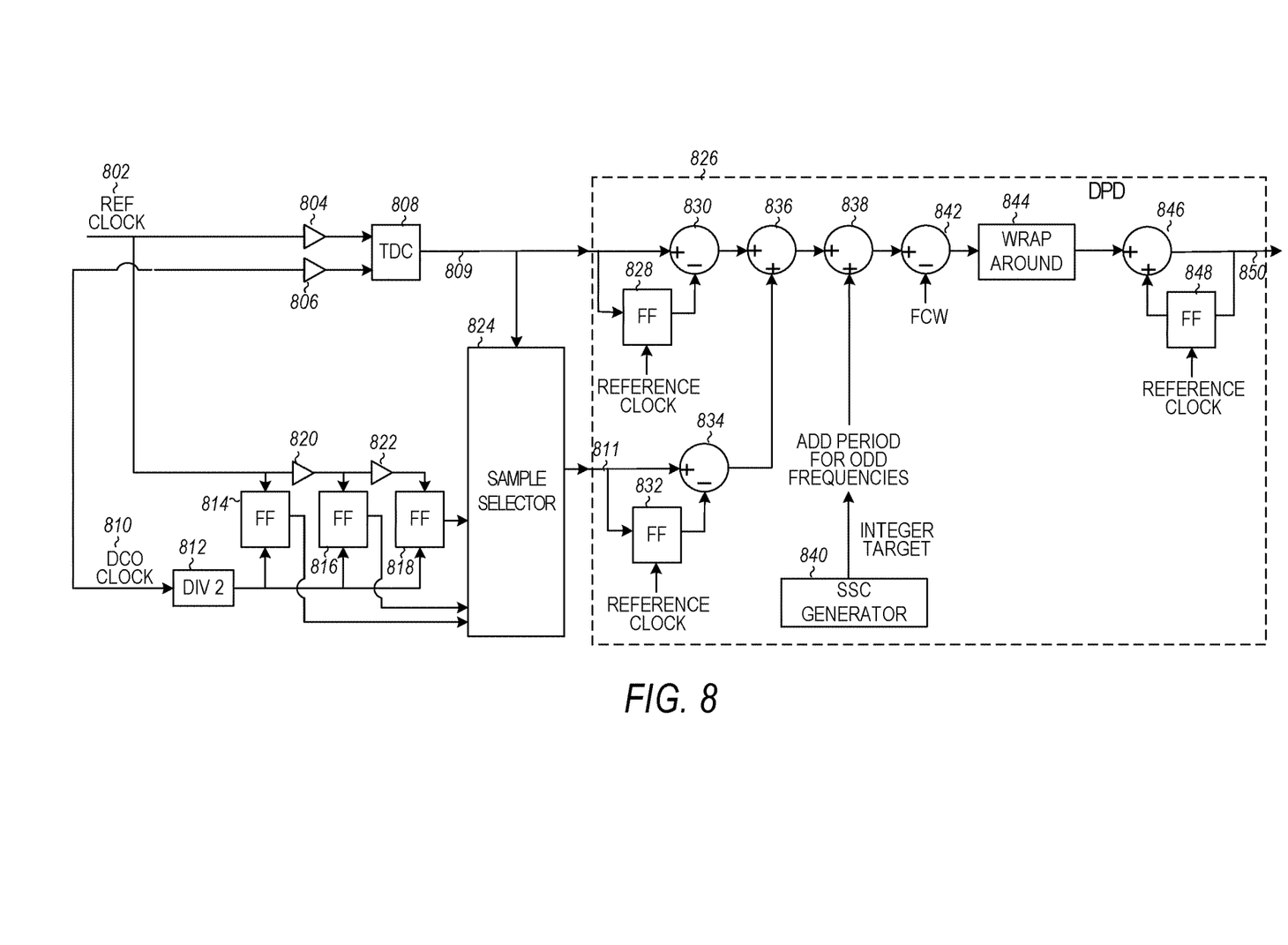
FIG. 8 illustrates another example of a divider-less fractional PLL architecture in accordance with some aspects of the present disclosure.
Figure 9:
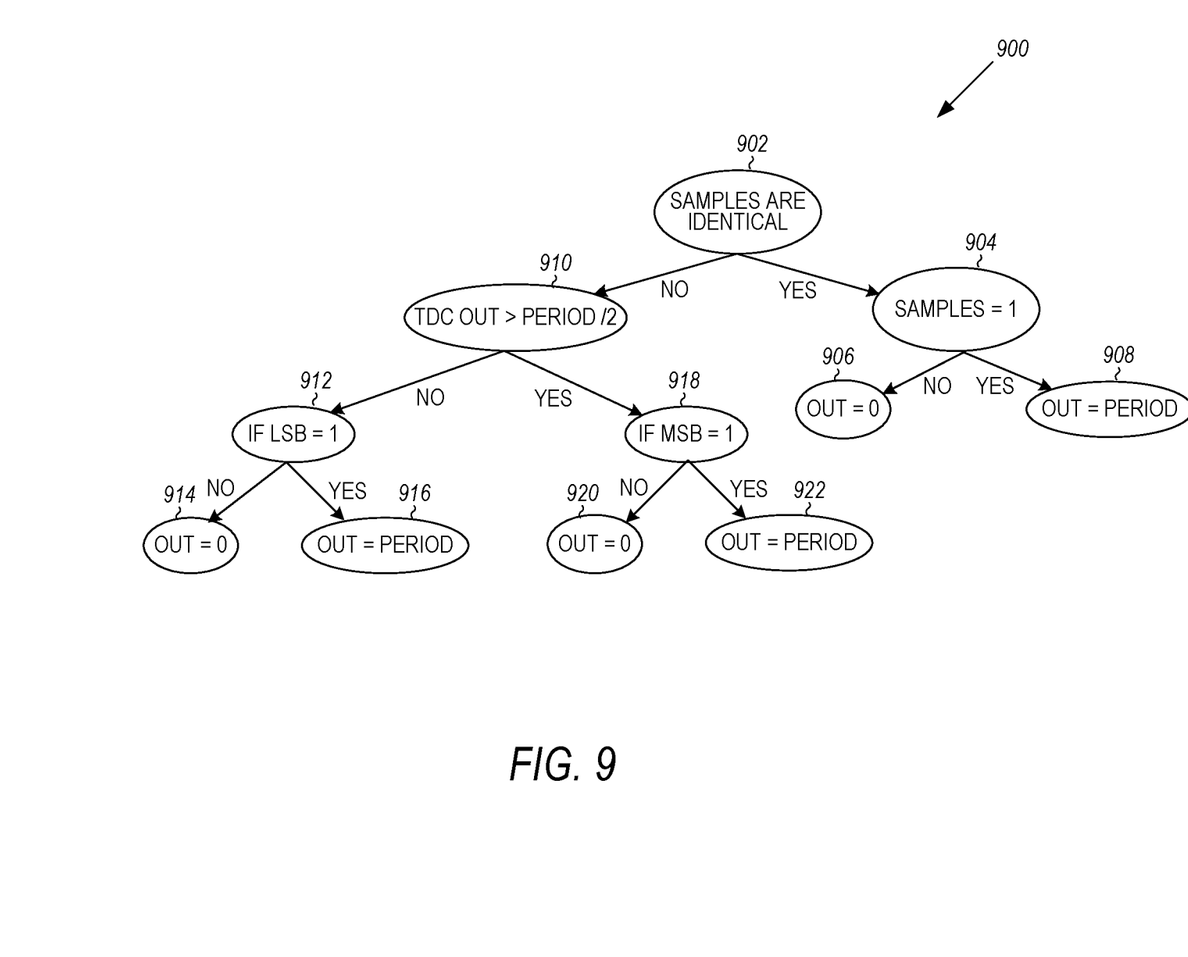
FIG. 9 illustrates a sample decision diagram for the divider-less fractional PLL architecture of FIG. 8, in accordance with some aspects of the present disclosure.

In an example and as seen in FIG. 5, a counter 512 can be used in parallel to the TDC 504. More specifically, the counter 512 can be configured to receive the PLL output frequency signal 516, and count the PLL output frequency to detect and track instantaneous reference noise greater than, e.g., half a DCO cycle. A sampler 514 can be used to sample the output of the counter 512 using a replica of the TDC 504 output to handle timing mismatch between the main TDC and the counter. A decision algorithm (e.g., as illustrated in FIG. 9) can be applied to the sampled results to determine an optimal value of the sample. The sample selection algorithm may be implemented as a sample selection block (e.g., separately from the sampler as seen in FIG. 8 or within the sampler 514), and may use the TDC 504 output to make the sample selection. The selected sample may be communicated to the DPD 506 as a complementary information to the TDC 504 phase measurement output, to correct the TDC phase data that was corrupted by jitter in the reference signal 502. By using the counter and sampler as disclosed herein, this technique can extend tolerance of the PLL 320 to reference jitter by at least a factor of two.

Figure 6:
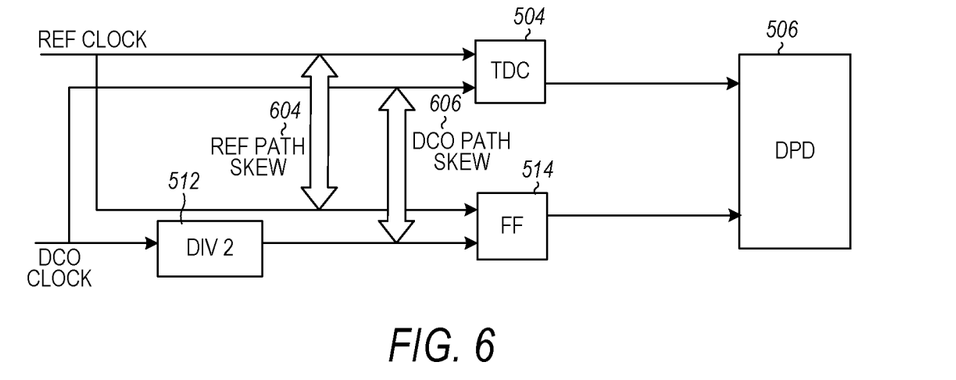
FIG. 6 illustrates timing mismatch between reference clock and digitally controlled oscillator (DCO) clock in a divider-less fractional PLL architecture in accordance with some aspects of the present disclosure.

FIG. 6 illustrates timing mismatch between reference clock and digitally controlled oscillator (DCO) clock in a divider-less fractional PLL architecture in accordance with some aspects of the present disclosure. Referring to FIG. 6, the counter 512 can be a divide-by-2 circuit, and the sampler 514 can be a flip-flop (FF). In an example, signal skew 604 can exist between the reference clock signal 502 input into the TDC 504 and the reference signal input into the sampler 514. Similarly, signal skew 606 can exist between the DCO clock signal 516 input into the TDC 504 and the DCO clock signal input into the sampler 514.

The timing skew between the DCO clock paths (606) and the reference clock paths (604) can cause the sampling of an incorrect data at the output of the counter 512. Sampling of incorrect data can result in incorrect data output by the DPD 506, causing deterministic jitter of the PLL output clock. In an example, the sampler 514 can provide multiple samples using delayed versions of the reference signal 502, to overcome the timing skew between the DCO clock paths and the reference clock paths (as explained in greater detail in FIGS. 7-9).

FIG. 8 illustrates another example of a divider-less fractional PLL architecture in accordance with some aspects of the present disclosure. Referring to FIG. 8, there is illustrated another example of the divider-less fractional PLL 320 (FIG. 8 does not include the filter and the DCO for simplicity). The PLL 320 can include a TDC 808, a counter 812 (e.g., a divide-by-2 circuit), and a DPD 826. In an example, the PLL 320 can include a sampler configured to generate a plurality of samples. In this regard, the sampler can include flip-flops 814-818, which can provide a plurality of samples (e.g., three samples) using the divided DCO clock signal 810 and delayed versions of the reference clock signal 802. More specifically, the reference clock signal 802 can be sampled by the first FF 814, a delayed version of signal 802 (delayed by delay buffer 820) can be sampled by FF 816, and another delayed version of signal 802 (delayed by delay buffer 822) can be sampled by FF 818. Delay buffers 804 and 806 can be used to delay signals 802 and 810 at the input of the TDC 808 (in this regard, the same delay is applied to signal 802 communicated to TDC 808 and FF 816). The timing diagrams of the delayed versions of signal 802 as well as signals 810 and its corresponding divided version are illustrated in FIG. 7.

Figure 7:
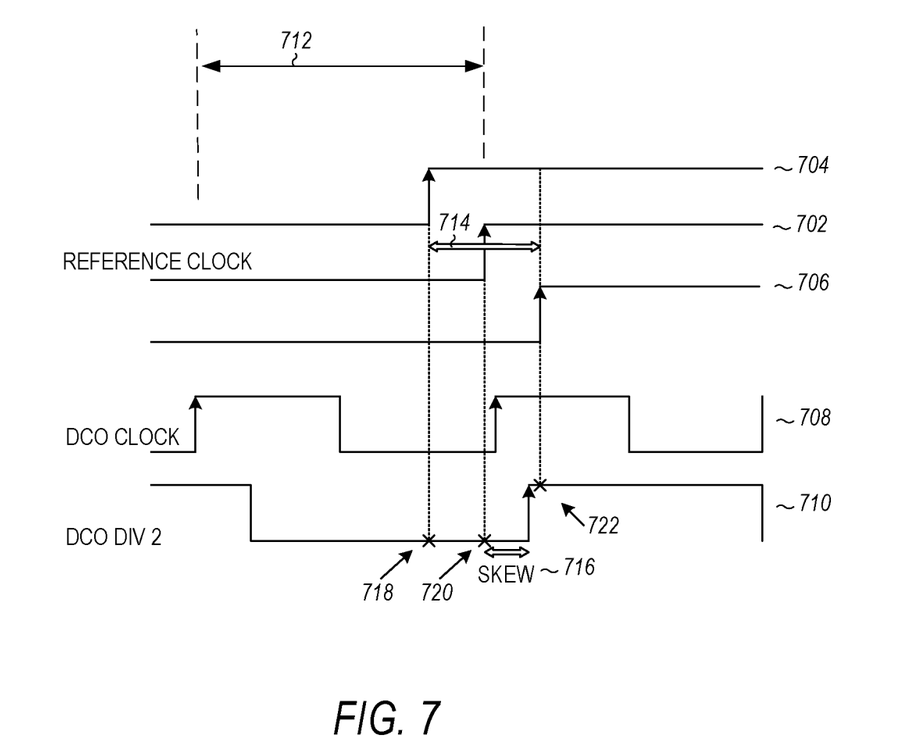
FIG. 7 illustrates timing diagrams of a DCO clock signal and multiple versions of a reference clock signal when selecting a plurality of samples in a divider-less fractional PLL architecture in accordance with some aspects of the present disclosure.

FIG. 7 illustrates timing diagrams of a DCO clock signal and multiple versions of a reference clock signal when selecting a plurality of samples in a divider-less fractional PLL architecture in accordance with some aspects of the present disclosure. Referring to FIG. 7, the timing diagrams 704, 702, and 706 correspond to the reference clock signal 802 input into FFs 814, 816, and 818, respectively. The timing diagram 708 corresponds to the DCO clock signal 810, and the timing diagram 710 corresponds to the DCO clock at the output of the divide-by-2 block 812.

In an example, the period measurement 712 can represent a maximum possible period measurement by the TDC 808, representing the phase difference between a rising edge of the DCO clock signal 810 and the reference clock signal 802 (as delayed by buffer 820, and represented by diagram 702). In an example, the period (which is the difference between sequential rising edges of the DCO) can be measured in TDC units (or TDC steps). For example, the TDC measures a phase in picoseconds (ps) and converts it to a digital word that expresses the phase difference in TDC units. If cycle time is 100 ps and TDC step is 5 ps then the period is equal to 20 TDC steps.

In an example, the delay buffers 820 and 822 may be selected so that the skew 714 between the reference signals to FF 814 (graph 704) and 818 (graph 706) is larger than the skew 716 between the DCO clock signal 810 and the divided version at the output of the counter 812.

In an example, the divided DCO signal can be sampled at rising edges of the three reference signal versions corresponding to graphs 704, 702, 706, generating samples 718, 720, and 722, respectively. The samples 718-722 can be communicated to the sample selector block 824, where a single sample can be selected based on a sample selection algorithm. An example sample selection algorithm is described herein in reference to FIG. 9.

FIG. 9 illustrates a sample decision diagram for the divider-less fractional PLL architecture of FIG. 8, in accordance with some aspects of the present disclosure. Referring to FIG. 9, the sample selection algorithm 900 may be used by the sample selector 824 to select one of the samples 718, 720, and 722 for further processing by the DPD 826. As used in FIG. 9, the term LSB is used to indicate the left sample 718, and the term MSB is used to indicate the right sample 722. As used in FIG. 9, the term "Period" refers to the maximum expected phase measurement by the TDC 808 (e.g., period 712 as seen in FIG. 7).

Even though three samples (corresponding to three versions of the reference clock signal 802) are illustrated in FIG. 7, the disclosure is not limited in this regard and a different number of samples may be generated as well. In this regard, a higher number of samples may necessitate the use of a higher number of flip-flops in the sampler 512 and a higher number of delay buffers used in connection with the flip-flops.

At 902, it may be determined whether the samples 718-722 are identical. If the samples are identical, at 904, it may be determined whether the samples equal 1. If all the samples equal 1, then at 908, the sample selector 824 can output Period. If all the samples do not equal 1, then at 906, the sample selector 824 can output zero.

If the samples are not identical, at 910, it may be determined whether the output from TDC 808 is greater than half the Period. If the TDC output is greater than half the period, then at 918 it may be determined whether MSB (i.e., sample 722) is equal to 1. At 922, if MSB=1, then the sample selector 824 can output Period. At 920, if MSB does not equal 1, then the sample selector 824 can output zero.

If the output from TDC 808 is not greater than half the Period, at 912, it may be determined whether LSB (i.e., sample 718) is equal to 1. If LSB is equal to 1, at 916, the sample selector 824 can output Period. If LSB does not equal 1, at 914, the sample selector 824 can output zero.

Referring again to FIG. 8, the DPD 826 can receive the phase difference output signal 809 from the TDC 808 and the sample 811 selected by the sample selector 824. The phase difference output signal 809 can be differentiated using the flip-flop 828 and adder 830. The sample 811 can also be differentiated using the flip-flop 832 and adder 834. The differentiated phase difference output signal and the differentiated sample can be added using adder 836 to obtain a frequency signal. The adder 838 can be used to add a value of one DCO cycle for odd integer ratios of the frequency signal at the output of adder 836. The DCO cycle can be counted by TDC steps and it may be calculated by an internal SEM (Statistic Extraction Machine) function (not illustrated in FIG. 8). The DCO determination functionality may also take into account any instantaneous ratio changes due to the spread spectrum clock (SSC) modulation by the SSC generator 840.

In an example, the differentiator (elements 830 and 828) measures the phase advancing rate, which is the fraction part of the frequency ratio between DCO clock 810 and reference clock 802. The subtractor 842 can be used to compare the measured fraction part of the frequency ratio with the target frequency fraction ratio (FCW or frequency command word). Ideally, the subtractor output (element 842 output) is zero if the PLL is locked on the target frequency. In instances when there is a TDC measurement wrap around (TDC can measure up to a DCO period, and the phase after the DCO period can wrap around), then the subtraction result is a period. The following is an example of the wrap around functionality where the ratio frequency is 2.2 and the FCW is 0.2 (which is the fraction part) (the example numbers below are normalized to DCO period so that −1 is equal to −1*DCO Period).

The wrap around function 844 can interpret −1 as zero and it converts the range of [−2*period; 2*period] into [−period/2; period/2], which is the area around zero (+/−period/2), where "period" is the DCO period. In this regard, margin to tolerance to noise can be extended up to a DCO period, and the frequency error measurement range can be extended from +/−Period/2 to +/−Period (or by a factor of 2).

In an example (not illustrated in FIG. 8), the output of the DCO (e.g., 510) can be coupled to a divider (e.g., divide-by-2) and a counter. The output of the counter and the reference clock can be provided as inputs to a flip-flop. The output of the flip-flop can be input to a detector-and-filter block. The output of the detector-and-filter block can be input to an adder together with an output of the PLL filter (e.g., 508). The output of the adder can be input into the DCO (e.g., 510). In this regard, when odd frequency is generated at the output of adder 836 (i.e., the integer part of the frequency is odd, such as for example 301.2, 301.5, 303.2, 303.7, . . . ), element 838 can be used to add a period to the frequency measurement. Since the counter is power of two, the modulo of the mod(integer_target/counter) is equal to one, a period can be added in order to use the same wrap around function for odd and even frequencies. Put another way, for odd frequencies, the counter sampling does wrap around each measurement and, therefore, a period can be added in order to shift the measurement in order to use the same wrap around function for odd and even frequencies. Additionally, the divide-by-2 counter in the above example aspect extends tolerance to reference noise by a factor of 2, meaning the PLL can handle reference noise up to a DCO cycle, instead of half DCO period without this example aspect.

The subtractor 842 can be used to sum the resulting frequency signal at output of adder 838 with a frequency command word (FCW). The subtractor 842 can be used to calculate the delta between the measured frequency and the target frequency (i.e., the fraction part). In instances when the PLL is locked, the subtractor 842 output is zero (except when there is a wrap-around, then it will be −/+Period without the ref noise feature, or −/+2*Period with the additional divide-by-2 counter mechanism explained above).

A wrap-around function 844 may then be applied to extend a wrap-around threshold of the frequency signal at output of subtractor 842 from Period/2 to Period. The frequency signal at the output of the wrap-around function 844 can be integrated using the adder 846 and flip-flop 848, to generate an output phase error signal 850. The output phase error signal may then be communicated to a filter (e.g., 508) and a DCO (e.g., 510) to generate a fractional output frequency (e.g., 516).

Figure 10:
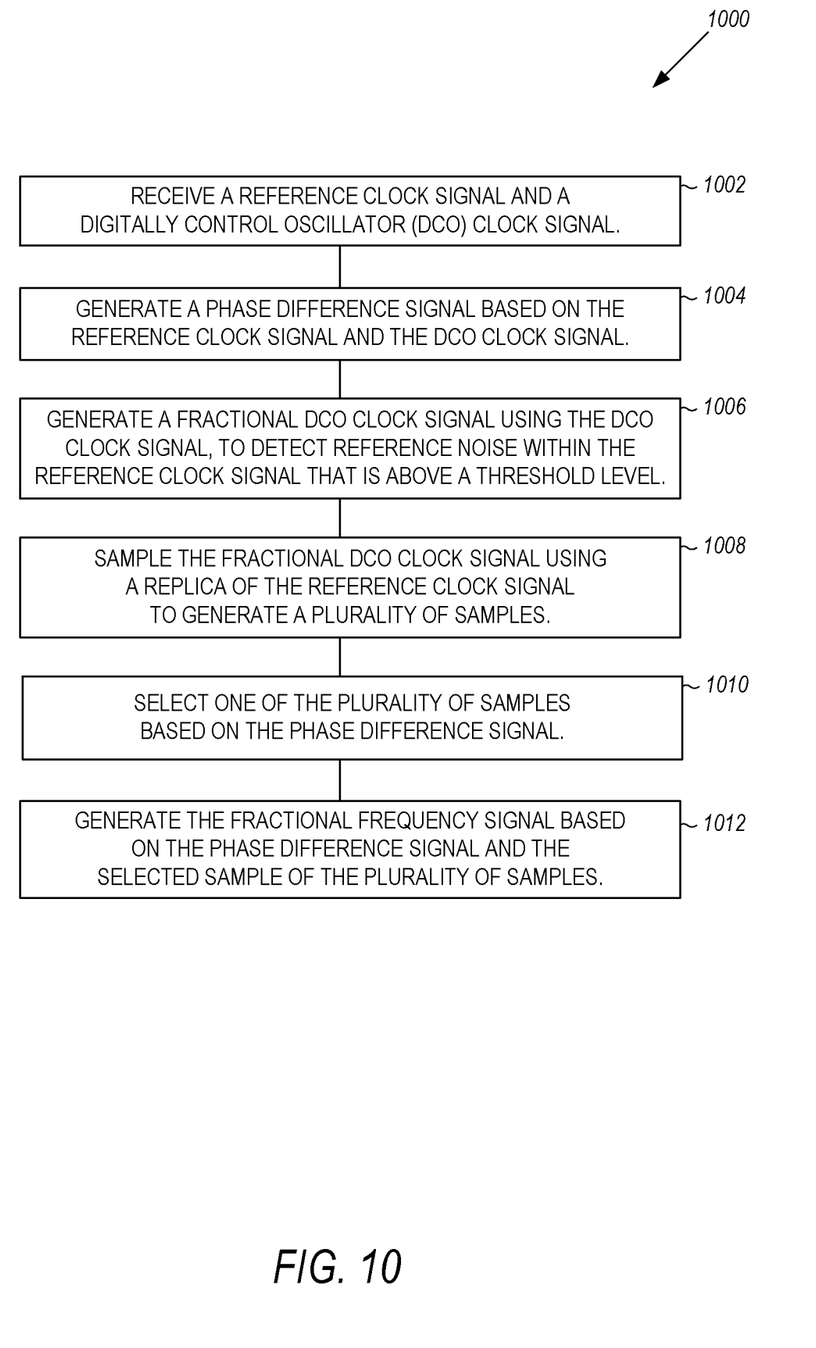
FIG. 10 is an example flow diagram of a method for generating a fractional frequency signal in accordance with some aspects of the present disclosure.

FIG. 10 is an example flow diagram of a method for generating a fractional frequency signal in accordance with some aspects of the present disclosure. Referring to FIG. 10, the example method 1000 for generating a fractional frequency signal may start at 1002, when a reference clock signal and a digitally controlled oscillator (DCO) clock signal can be received. For example, the TDC 504 may receive the reference signal 502 and the DCO clock signal 516. At 1004, a phase difference signal may be generated based on the reference clock signal and the DCO clock signal. For example, the TDC 504 can generate the phase difference signal based on the reference signal 502 and the DCO clock signal 516. At 1006, a fractional DCO clock signal can be generated using the DCO clock signal, to detect reference noise within the reference clock signal that is above a threshold level. For example, the counter 512 can be a frequency divide-by-2 circuit, which can be configured to detect and track instantaneous reference noise that exceeds one-half of DCO cycle. At 1008, the fractional DCO clock signal can be sampled using a replica of the reference clock signal to generate a plurality of samples. For example, the sampler 514 can include flip-flops 814-818, each receiving a different replica of the reference clock signal 802. More specifically, FF 814 receives reference signal 802 without delay, FF 816 receives reference signal 802 after delay by buffer 820, and FF 818 receives reference signal 802 after delay by buffers 820 and 822. The FFs 814-818 can generate samples 718-722, which are communicated to the sample selector 824.

At 1010, one of the plurality of samples may be selected based on the phase difference signal. For example, the sample selector 824 can select one of the samples based on the phase difference signal generated by the TDC 808 (e.g., as explained in reference to FIG. 9). At 1012, the fractional frequency signal can be generated based on the phase difference signal and the selected sample of the plurality of samples. For example, the selected sample and the TDC output signal are communicated to the DPD 826, which generates a phase error signal 850. The phase error signal can then be communicated to a filter (e.g., 508) and a DCO (e.g., 510) for generating the fractional frequency signal (e.g., 516).

ADDITIONAL NOTES & EXAMPLES

Example 1 is a fractional digital phase locked loop (PLL), comprising: a time-to-digital converter (TDC) to receive a reference clock signal and a digitally control oscillator (DCO) clock signal, and generate a phase difference signal based on the reference clock signal and the DCO clock signal; a counter coupled in parallel to the TDC, the counter to receive the DCO clock signal and count an output frequency of the DCO clock signal to detect reference noise within the reference clock signal that is above a threshold level; a sampler to sample an output of the counter using a replica of the reference clock signal, and generate a plurality of samples; a sample selector to select one of the plurality of samples based on the phase difference signal output from the TDC; and a digital phase detector (DPD) to generate an output phase measurement based on the phase difference signal and the selected sample of the plurality of samples.

In Example 2, the subject matter of Example 1 optionally includes circuit.

In Example 3, the subject matter of any one or more of Examples 1-2 optionally include wherein the threshold level is a fraction of a frequency cycle of the DCO clock signal.

In Example 4, the subject matter of Example 3 optionally includes wherein the threshold level is one-half of the frequency cycle of the DCO clock signal.

In Example 5, the subject matter of any one or more of Examples 1-4 optionally include wherein the sampler comprises a plurality of flip-flops, each of the plurality of flip-flops configured to sample the output of the counter using a corresponding one of a plurality of delayed versions of the reference clock signal.

In Example 6, the subject matter of Example 5 optionally includes a plurality of serially connected delay buffers, each of the delay buffers for generating one of the plurality of delayed version of the reference clock signal.

In Example 7, the subject matter of any one or more of Examples 1-6 optionally include a filter to filter the output phase measurement; and a digitally controlled oscillator (DCO) to generate the DCO clock signal based on the filtered phase measurement.

In Example 8, the subject matter of Example 7 optionally includes wherein the DCO clock signal has a frequency that is a fraction of a frequency of the reference clock signal.

In Example 9, the subject matter of any one or more of Examples 1-8 optionally include wherein the sample selector is to select one of a zero frequency sample or a period frequency based on a comparison of the phase difference signal output from the TDC and a fraction of the period frequency, wherein the period frequency is a maximum expected measurement of the TDC.

In Example 10, the subject matter of any one or more of Examples 1-9 optionally include wherein the DPD further comprises: a first differentiator to differentiate the phase difference signal; and a second differentiator to differentiate the selected one of the plurality of samples.

In Example 11, the subject matter of Example 10 optionally includes wherein the DPD is to: adjust the differentiated phase difference signal with the differentiated selected one of the plurality of samples to generate a fractional frequency signal.

In Example 12, the subject matter of Example 11 optionally includes wherein the DPD further comprises: a wrap-around function to extend a wrap-around threshold of the fractional frequency signal; and an integrator to generate the output phase measurement using the fractional frequency signal.

Example 13 is an apparatus of a wireless device, the apparatus comprising: a synthesizer to generate a synthesized frequency using a fractional frequency signal; and a mixer to mix a received radio frequency (RF) signal with the synthesized frequency to generate a down-converted signal, wherein the synthesizer comprises a fractional digital phase locked loop (PLL) to: receive a reference clock signal and a digitally control oscillator (DCO) clock signal; generate a phase difference signal based on the reference clock signal and the DCO clock signal; generate a fractional DCO clock signal to detect reference noise within the reference clock signal that is above a threshold level; sample the fractional DCO clock signal using a replica of the reference clock signal to generate a plurality of samples; and generate the fractional frequency signal based on the phase difference signal and a selected sample of the plurality of samples.

In Example 14, the subject matter of Example 13 optionally includes an antenna to receive the RF signal.

In Example 15, the subject matter of any one or more of Examples 13-14 optionally include an amplifier to amplify the down-converted signal to generate an amplified signal; and a filter to filter the amplified signal to generate a baseband signal.

In Example 16, the subject matter of any one or more of Examples 13-15 optionally include wherein the fractional digital PLL further comprises: a time-to-digital converter (TDC) to generate the phase difference signal; a counter circuit to generate the fractional DCO clock signal; and a sampler circuit to generate the plurality of samples.

In Example 17, the subject matter of Example 16 optionally includes wherein the sampler circuit comprises a plurality of serially connected flip-flops, each of the plurality of flip-flops receiving a delayed version of the reference clock signal and the fractional DCO clock signal.

In Example 18, the subject matter of any one or more of Examples 13-17 optionally include wherein the fractional digital PLL further comprises: a digital phase detector (DPD) to generate an output phase measurement based on the phase difference signal and the selected sample of the plurality of samples.

In Example 19, the subject matter of Example 18 optionally includes wherein the fractional digital PLL further comprises: a filter receiving the output phase measurement to generate a filtered phase measurement; and a digitally controlled oscillator receiving the filtered phase measurement to generate the fractional frequency signal.

Example 20 is a method to generate a fractional frequency signal, the method comprising: receiving a reference clock signal and a digitally control oscillator (DCO) clock signal; generating a phase difference signal based on the reference clock signal and the DCO clock signal; generating a fractional DCO clock signal using the DCO clock signal, to detect reference noise within the reference clock signal that is above a threshold level; sampling the fractional DCO clock signal using a replica of the reference clock signal to generate a plurality of samples; selecting one of the plurality of samples based on the phase difference signal; and generating the fractional frequency signal based on the phase difference signal and the selected sample of the plurality of samples.

In Example 21, the subject matter of Example 20 optionally includes wherein the selecting one of the plurality of samples comprises: selecting one of a zero frequency sample or a period frequency based on a comparison of the phase difference signal and a fraction of the period frequency, wherein the period frequency is a maximum expected measurement of a phase difference between the reference clock signal and the DCO clock signal.

In Example 22, the subject matter of Example 21 optionally includes differentiating the phase difference signal to generate a first differentiated frequency signal; differentiating the selected one of the plurality of samples to generate a second differentiated frequency signal; and adjusting the first differentiated frequency signal with the second differentiated frequency signal to generate a fractional frequency signal.

In Example 23, the subject matter of Example 22 optionally includes adding the period frequency to the fractional frequency signal, when the fractional frequency signal comprises an odd frequency.

In Example 24, the subject matter of any one or more of Examples 22-23 optionally include applying a wrap-around function to the fractional frequency signal to extend a wrap-around threshold of the fractional frequency signal.

In Example 25, the subject matter of Example 24 optionally includes applying a frequency control word to the fractional frequency signal to generate an adjusted fractional frequency signal.

In Example 26, the subject matter of Example 25 optionally includes integrating the adjusted fractional frequency signal to generate an output phase error measurement; and generating the fractional frequency signal based on the output phase error measurement.

In Example 27, the subject matter of any one or more of Examples 20-26 optionally include wherein generating the fractional DCO clock signal comprises dividing the DCO clock signal in half.

Example 28 is at least one machine-readable medium that, when executed by a machine, causes the machine to perform any of the methods of Examples 20-27.

Example 29 is a device comprising means to perform any of the methods of Examples 20-27.

The above detailed description includes references to the accompanying drawings, which form a part of the detailed description. The drawings show, by way of illustration, specific aspects of the present disclosure that may be practiced. These aspects of the present disclosure are also referred to herein as "examples." Such examples may include elements in addition to those shown or described. However, also contemplated are examples that include the elements shown or described. Moreover, also contemplated are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

The above description is intended to be illustrative, and not restrictive. For example, the above-described examples (or one or more aspects thereof) may be used in combination with others. Other aspects of the present disclosure may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. However, the claims may not set forth every feature disclosed herein as aspects of the present disclosure may feature a subset of said features. Further, aspects of the present disclosure may include fewer features than those disclosed in a particular example. Thus, the following claims are hereby incorporated into the Detailed Description, with a claim standing on its own as a separate embodiment. The scope of the aspects of the present disclosure disclosed herein is to be determined with reference to the appended claims, along with the full scope of equivalents to which such claims are entitled.

What is claimed is:

1. A fractional digital phase locked loop (PLL), comprising:
   a time-to-digital converter (TDC) to receive a reference clock signal and a digitally controlled oscillator (DCO) clock signal, and generate a phase difference signal based on the reference clock signal and the DCO clock signal;
   a counter coupled in parallel to the TDC, the counter to receive the DCO clock signal and count an output frequency of the DCO clock signal to detect reference noise within the reference clock signal that is above a threshold level;
   a sampler to sample an output of the counter using a replica of the reference clock signal, and generate a plurality of samples;
   a sample selector to select one of the plurality of samples based on the phase difference signal output from the TDC; and
   a digital phase detector (DPD) to generate an output phase measurement based on the phase difference signal and the selected sample of the plurality of samples.

2. The fractional digital PLL of claim 1, wherein the counter is a divide-by-2 circuit.

3. The fractional digital PLL of claim 1, wherein the threshold level is a fraction of a frequency cycle of the DCO clock signal.

4. The fractional digital PLL of claim 3, wherein the threshold level is one-half of the frequency cycle of the DCO clock signal.

5. The fractional digital PLL of claim 1, wherein the sampler comprises a plurality of flip-flops, each of the plurality of flip-flops configured to sample the output of the counter using a corresponding one of a plurality of delayed versions of the reference clock signal.

6. The fractional digital PLL of claim 5, further comprising:
   a plurality of serially connected delay buffers, each of the delay buffers for generating one of the plurality of delayed version of the reference clock signal.

7. The fractional digital PLL of claim 1, further comprising:
   a filter to filter the output phase measurement; and
   a digitally controlled oscillator (DCO) to generate the DCO clock signal based on the filtered phase measurement.

8. The fractional digital PLL of claim 7, wherein the DCO clock signal has a frequency that is a fraction of a frequency of the reference clock signal.

9. The fractional digital PLL of claim 1, wherein the sample selector is to select one of a zero frequency sample or a period frequency based on a comparison of the phase difference signal output from the TDC and a fraction of the period frequency, wherein the period frequency is a maximum expected measurement of the TDC.

10. The fractional digital PLL of claim 1, wherein the DPD further comprises:
    a first differentiator to differentiate the phase difference signal; and
    a second differentiator to differentiate the selected one of the plurality of samples.

11. The fractional digital PLL of claim 10, wherein the DPD is to:
    adjust the differentiated phase difference signal with the differentiated selected one of the plurality of samples to generate a fractional frequency signal.

12. The fractional digital PLL of claim 11, wherein the DPD further comprises:
    a wrap-around function to extend a wrap-around threshold of the fractional frequency signal; and
    an integrator to generate the output phase measurement using the fractional requency signal.

13. An apparatus of a wireless device, the apparatus comprising:
    a synthesizer to generate a synthesized frequency using a fractional frequency signal; and
    a mixer to mix a received radio frequency (RF) signal with the synthesized frequency to generate a downconverted signal,
    wherein the synthesizer comprises a fractional digital phase locked loop (PLL) to:
      receive a reference clock signal and a digitally controlled oscillator (DCO) clock signal;
      generate a phase difference signal based on the reference clock signal and the DCO clock signal;
      generate a fractional DCO clock signal to detect reference noise within the reference clock signal that is above a threshold level;
      sample the fractional DCO clock signal using a replica of the reference clock signal to generate a plurality of samples; and
      generate the fractional frequency signal based on the phase difference signal and a selected sample of the plurality of samples.

14. The apparatus of claim 13, further comprising an antenna to receive the RF signal.

15. The apparatus of claim 13, further comprising:
    an amplifier to amplify the downconverted signal to generate an amplified signal; and
    a filter to filter the amplified signal to generate a baseband signal.

16. The apparatus of claim 13, wherein the fractional digital PLL further comprises:
    a time-to-digital converter (TDC) to generate the phase difference signal;
    a counter circuit to generate the fractional DCO clock signal; and
    a sampler circuit to generate the plurality of samples.

17. The apparatus of claim 16, wherein the sampler circuit comprises a plurality of serially connected flip-flops, each of the plurality of flip-flops receiving a delayed version of the reference clock signal and the fractional DCO clock signal.

18. The apparatus of claim 13, wherein the fractional digital PLL further comprises:
    a digital phase detector (DPD) to generate an output phase measurement based on the phase difference signal and the selected sample of the plurality of samples.

19. The apparatus of claim 18, wherein the fractional digital PLL further comprises:
    a filter receiving the output phase measurement to generate a filtered phase measurement; and
    a digitally controlled oscillator receiving the filtered phase measurement to generate the fractional frequency signal.

20. A method to generate a fractional frequency signal, the method comprising:

receiving a reference clock signal and a digitally controlled oscillator (DCO) clock signal;
generating a phase difference signal based on the reference clock signal and the DCO clock signal;
generating a fractional DCO clock signal using the DCO clock signal, to detect reference noise within the reference clock signal that is above a threshold level;
sampling the fractional DCO clock signal using a replica of the reference clock signal to generate a plurality of samples;
selecting one of the plurality of samples based on the phase difference signal; and
generating the fractional frequency signal based on the phase difference signal and the selected sample of the plurality of samples.

21. The method according to claim 20, wherein the selecting one of the plurality of samples comprises:
selecting one of a zero frequency sample or a period frequency based on a comparison of the phase difference signal and a fraction of the period frequency, wherein the period frequency is a maximum expected measurement of a phase difference between the reference clock signal and the DCO clock signal.

22. The method according to claim 21, further comprising:
differentiating the phase difference signal to generate a first differentiated frequency signal;
differentiating the selected one of the plurality of samples to generate a second differentiated frequency signal; and
adjusting the first differentiated frequency signal with the second differentiated frequency signal to generate a fractional frequency signal.

23. The method according to claim 22, further comprising:
adding the period frequency to the fractional frequency signal, when the fractional frequency signal comprises an odd frequency.

24. The method according to claim 22, further comprising:
applying a wrap-around function to the fractional frequency signal to extend a wrap-around threshold of the fractional frequency signal.

25. The method according to claim 24, further comprising:
applying a frequency control word to the fractional frequency signal to generate an adjusted fractional frequency signal.

26. The method according to claim 25, further comprising:
integrating the adjusted fractional frequency signal to generate an output phase error measurement; and
generating the fractional frequency signal based on the output phase error measurement.

27. The method according to claim 20, wherein generating the fractional DCO clock signal comprises dividing the DCO clock signal in half.

* * * * *

UNITED STATES PATENT AND TRADEMARK OFFICE
CERTIFICATE OF CORRECTION

PATENT NO. : 10,659,061 B2
APPLICATION NO. : 16/472835
DATED : May 19, 2020
INVENTOR(S) : Nassar et al.

Page 1 of 1

It is certified that error appears in the above-identified patent and that said Letters Patent is hereby corrected as shown below:

In the Claims

In Column 18, Line 13, in Claim 12, delete "requency" and insert --frequency-- therefor Signed and Sealed this
Fifth Day of January, 2021

Andrei Iancu
*Director of the United States Patent and Trademark Office*